US012805301B2

(12) United States Patent
Peng et al.

(10) Patent No.: US 12,805,301 B2
(45) Date of Patent: Nov. 17, 2026

(54) INTERCONNECTION STRUCTURE OF HIGH-DENSITY THREE-DIMENSIONAL (3D)-STACKED MEMORY AND PREPARATION METHOD FOR THE SAME

(71) Applicant: CHENGDU PBM TECHNOLOGY LTD., Chengdu (CN)

(72) Inventors: Jack Zezhong Peng, Chengdu (CN); Ke Wang, Chengdu (CN)

(73) Assignee: CHENGDU PBM TECHNOLOGY LTD., Chengdu (CN)

( * ) Notice: Subject to any disclaimer, the term of this patent is extended or adjusted under 35 U.S.C. 154(b) by 358 days.

(21) Appl. No.: 18/694,067

(22) PCT Filed: Oct. 9, 2023

(86) PCT No.: PCT/CN2023/123546

§ 371 (c)(1),
(2) Date: Mar. 21, 2024

(87) PCT Pub. No.: WO2024/131211

PCT Pub. Date: Jun. 27, 2024

(65) Prior Publication Data

US 2025/0149445 A1 May 8, 2025

(30) Foreign Application Priority Data

Dec. 20, 2022 (CN) ........................ 202211638282.9

(51) Int. Cl.
*H10W 20/41* (2026.01)
*H10B 41/20* (2023.01)
(Continued)

(52) U.S. Cl.
CPC .......... *H10W 20/435* (2026.01); *H10B 41/20* (2023.02); *H10B 43/20* (2023.02); *H10W 20/47* (2026.01)

(58) Field of Classification Search
CPC ... H10W 20/435; H10W 20/47; H10W 20/01; H10W 20/43; H10B 41/20; H10B 43/20; H10B 41/50; H10B 43/50
See application file for complete search history.

(56) References Cited

U.S. PATENT DOCUMENTS

2004/0077178 A1* 4/2004 Yang .................. B81C 1/00404 257/E21.235
2010/0052042 A1* 3/2010 Tanaka .................. H10B 41/20 257/E21.409

(Continued)

FOREIGN PATENT DOCUMENTS

CN 103441127 A 12/2013
CN 103545279 A 1/2014

(Continued)

OTHER PUBLICATIONS

International Search Report mailed Jan. 6, 2024 in connection with International Patent Application No. PCT/CN2023/123546, 9 pgs. (including translation).

*Primary Examiner* — William B Partridge
*Assistant Examiner* — Ilker Ozden
(74) *Attorney, Agent, or Firm* — Chiesa Shahinian & Giantomasi PC

(57) ABSTRACT

Disclosed are an interconnection structure of a high-density three-dimensional (3D)-stacked memory and preparation method for same, relating to integrated circuit technologies, and in particular, to three-dimensional semiconductor memory technologies. According to the present disclosure, the interconnection structure of a high-density 3D-stacked memory includes a three-dimensional storage structure, which is formed by alternately stacked conductive layers and insulating layers, and a lead-out structure. A contact surface between the lead-out structure and an etching facade of the three-dimensional storage structure has a stepped edge line, and the etching facade is a plane of a side surface of the three-dimensional storage structure, which is generated due to etching and perpendicular to a bottom surface. The configuration wiring using the technology of the present disclosure occupies a significantly smaller chip area com- (Continued)

pared with the prior art while greatly reducing the series resistance of horizontal electrodes.

3 Claims, 12 Drawing Sheets

(51) Int. Cl.
*H10B 43/20* (2023.01)
*H10W 20/47* (2026.01)

(56) References Cited

U.S. PATENT DOCUMENTS

| | | | | |
|---|---|---|---|---|
| 2014/0015057 | A1 | 1/2014 | Lee et al. | |
| 2015/0325587 | A1* | 11/2015 | Chen | H10B 43/27<br>257/314 |
| 2019/0355738 | A1 | 11/2019 | Zhao et al. | |
| 2020/0227434 | A1 | 7/2020 | Lee et al. | |
| 2022/0028893 | A1* | 1/2022 | Lin | G11C 7/18 |
| 2022/0036931 | A1* | 2/2022 | Lin | G11C 8/14 |
| 2023/0038958 | A1* | 2/2023 | Lai | H10B 51/20 |
| 2023/0309298 | A1* | 9/2023 | Ohsawa | G11C 16/0483 |

FOREIGN PATENT DOCUMENTS

| | | | |
|---|---|---|---|
| CN | 109155317 | A | 1/2019 |
| CN | 111435664 | A | 7/2020 |
| CN | 113540152 | A | 10/2021 |
| CN | 113675215 | A | 11/2021 |
| CN | 115799216 | A | 3/2023 |

* cited by examiner

INTERCONNECTION STRUCTURE OF HIGH-DENSITY THREE-DIMENSIONAL (3D)-STACKED MEMORY AND PREPARATION METHOD FOR THE SAME

CROSS-REFERENCE TO RELATED APPLICATION(S)

This application is a National Stage under 35 U.S.C. 371 of International Patent Application No. PCT/CN2023/123546, filed Oct. 9, 2023, which claims the ben-efit and priority to Chinese Patent Application No. 202211638282.9, filed on Dec. 20, 2022; the disclo-sures of all of which are incorporated herein by reference in their entireties.

TECHNICAL FIELD

The present disclosure relates to the technical field of integrated circuits, and in particular, to a three-dimensional semiconductor memory technology.

BACKGROUND

Referring to FIG. 1, a three-dimensional memory in the prior art consists of alternately stacked conductive layers and insulating layers. Accessing each horizontal word line (WL) layer of the three-dimensional memory to connect each conductive layer to peripheral WL decoding circuits typically requires an alternating "etch-trim-etch-trim" process in a peripheral area of a memory array to form a stepped structure. Then, the conductive layer of each step can be connected to corresponding leads in the peripheral circuit via conductive contacts vertically landing on the WL layer. The advantage of using the alternating "etch-trim-etch-trim" process to form a stepped structure is that it minimizes the use of lithography steps. Through layer-by-layer "trimming" of a photoresist for photoresist ashing before etching each step, a stepped structure is gradually formed, significantly reducing the cost of the process. However, the wire configuration of this method results in a linear increase in the occupied chip area with the increase in the number of layers, which adversely affects both area utilization and horizontal parasitic resistance of the WL. For instance, assuming a step occupies a width of 0.5 um, 32 stacked WL layers would require a space of 0.5 um*32=16 μm. For those WLs with metal contacts of the horizontal WLs, which are away from the memory array, this results in an increase in the series resistance of horizontal electrodes. Particularly, for devices formed by stacked Polysilicon/Oxide-insulator/Polysilicon/Oxideinsulator (POPO) layers, polysilicon has relatively high sheet resistance, and horizontal conductors made of polysilicon are significantly affected by size variations.

SUMMARY

The technical problem to be solved by the present disclosure is to provide a high-density three-dimensional memory and a preparation method thereof, where a stepped structure at the edge of a memory array occupies a smaller area.

The technical solution adopted to solve the above technical problem in the present disclosure is an interconnection structure of a high-density three-dimensional (3D)-stacked memory, including a three-dimensional storage structure, which is formed by alternately stacked conductive layers and insulating layers, and a lead-out structure. A contact surface between the lead-out structure and an etching facade of the three-dimensional storage structure has a stepped edge line. The etching facade is a plane of a side surface of the three-dimensional storage structure, which is generated due to etching and perpendicular to a bottom surface.

Furthermore, the projection of the lead-out structure on the etching facade of the three-dimensional storage structure forms a stepped shape.

The present disclosure further provides a preparation method for an interconnection structure of a high-density 3D-stacked memory, including the following steps:

1) covering the top of a three-dimensional storage structure with a first-mask layer and then performing etching: if the top of the three-dimensional storage structure is a conductive layer, etching the first-mask layer to expose the top conductive layer in a stepped region; if the top of the three-dimensional storage structure is an insulating layer, etching both the first-mask layer and the insulating layer to expose the top conductive layer in the stepped region; where the three-dimensional storage structure is formed by vertically stacked conductive layers and insulating layers, and the stepped region is a preset region for forming a stepped structure in the three-dimensional storage structure;

2) covering the exposed conductive layer in the stepped region with a second-mask; and 3) setting N to 1, and then repeating the following steps (a) to (c) until the bottom conductive layer in the stepped region is exposed:

(a) etching to remove the second-mask in the $N^{th}$ step region, to expose the top of the three-dimensional storage structure beneath the second-mask, where the $N^{th}$ step region refers to a projection region of the $N^{th}$ step on a bottom surface of the second-mask;

(b) if the top of a currently exposed region is an insulating layer, vertically etching the currently exposed region of the three-dimensional storage structure until the conductive layer is exposed; if the top of the currently exposed region is a conductive layer, vertically etching the currently exposed region of the three-dimensional storage structure until a next conductive layer is exposed, where a face formed by etching the three-dimensional storage structure serves as an etching facade of the $N^{th}$ step; and (c) incrementing N by 1 and returning to step (a).

The etching facades of the steps in all layers are in the same plane.

In step 1), the preset stepped region is defined by a photoresist; the photoresist covers an upper surface of a first-mask, and the first-mask in the stepped region defined by the photoresist is etched.

Step 2) includes covering an upper surface of the three-dimensional storage structure with the second-mask and then removing the photoresist and the second-mask on the photoresist.

Furthermore, in step (a), the $N^{th}$ step region of the second-mask is defined by a photoresist, and then the defined region is isotropically etched.

The present disclosure achieves the following technical effects: the configuration wiring using the technology of the present disclosure occupies a significantly smaller chip area compared with the prior art while greatly reducing the series resistance of horizontal electrodes.

Figure 1:
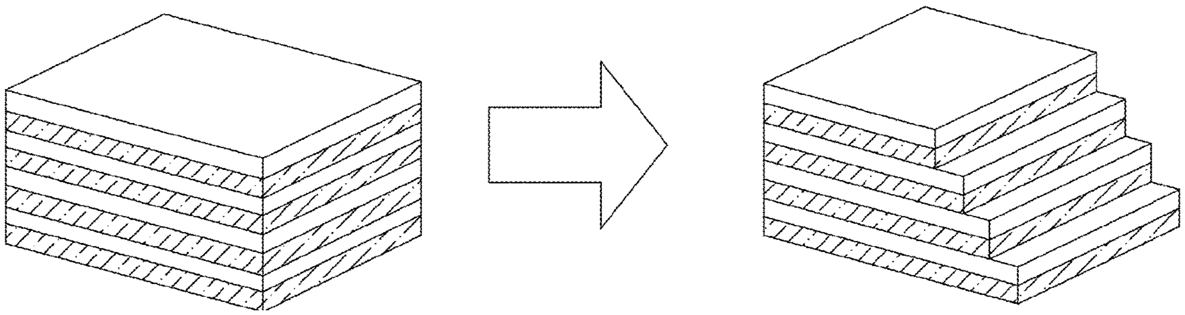
FIG. 1 is a schematic diagram of the prior art.

Reference Numerals: first-mask layer—11, conductive layer—12, second-mask layer—21, photoresist—22.

DETAILED DESCRIPTION OF THE EMBODIMENTS

Embodiment 1: Refer to FIG. 2 to FIG. 10

Figure 2:
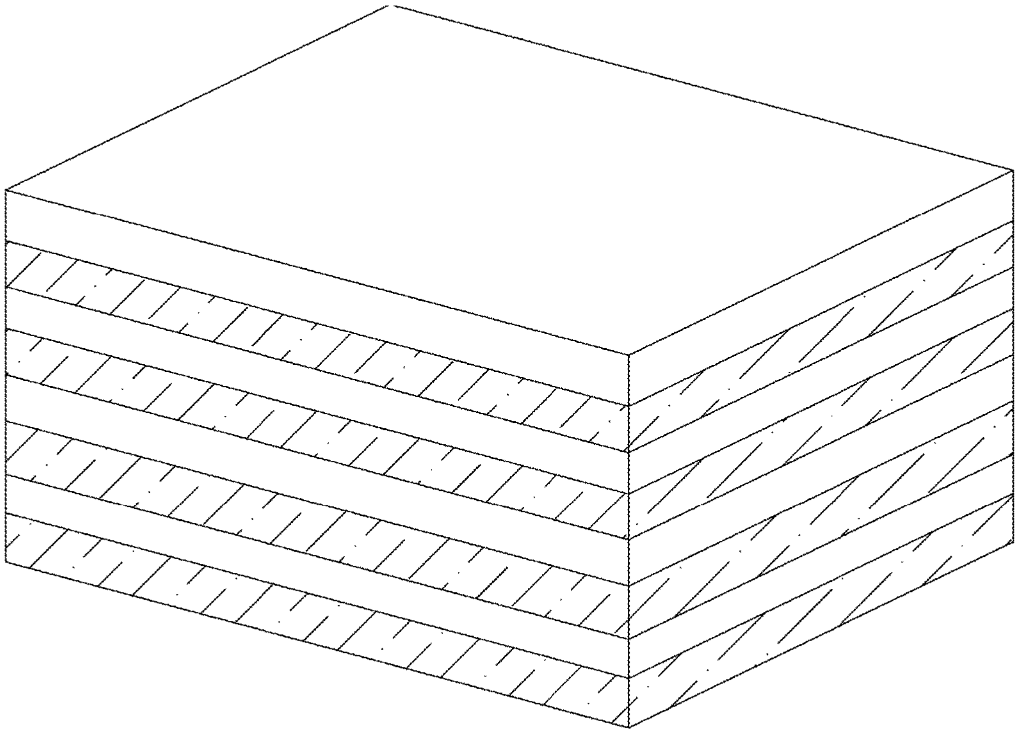
FIG. 2 is a schematic perspective view of a three-dimensional storage structure.
Figure 3:
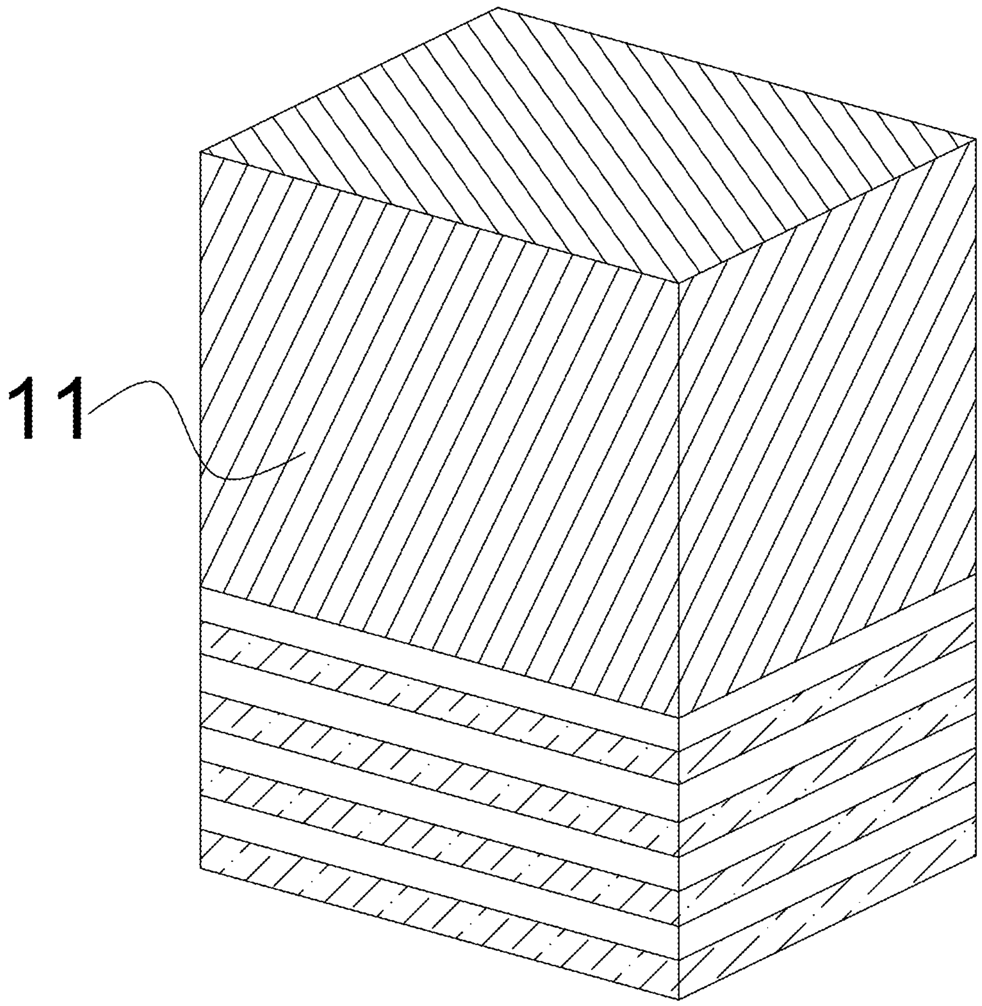
FIG. 3 is a schematic diagram of a three-dimensional storage structure covered with a first-mask layer.
Figure 4:
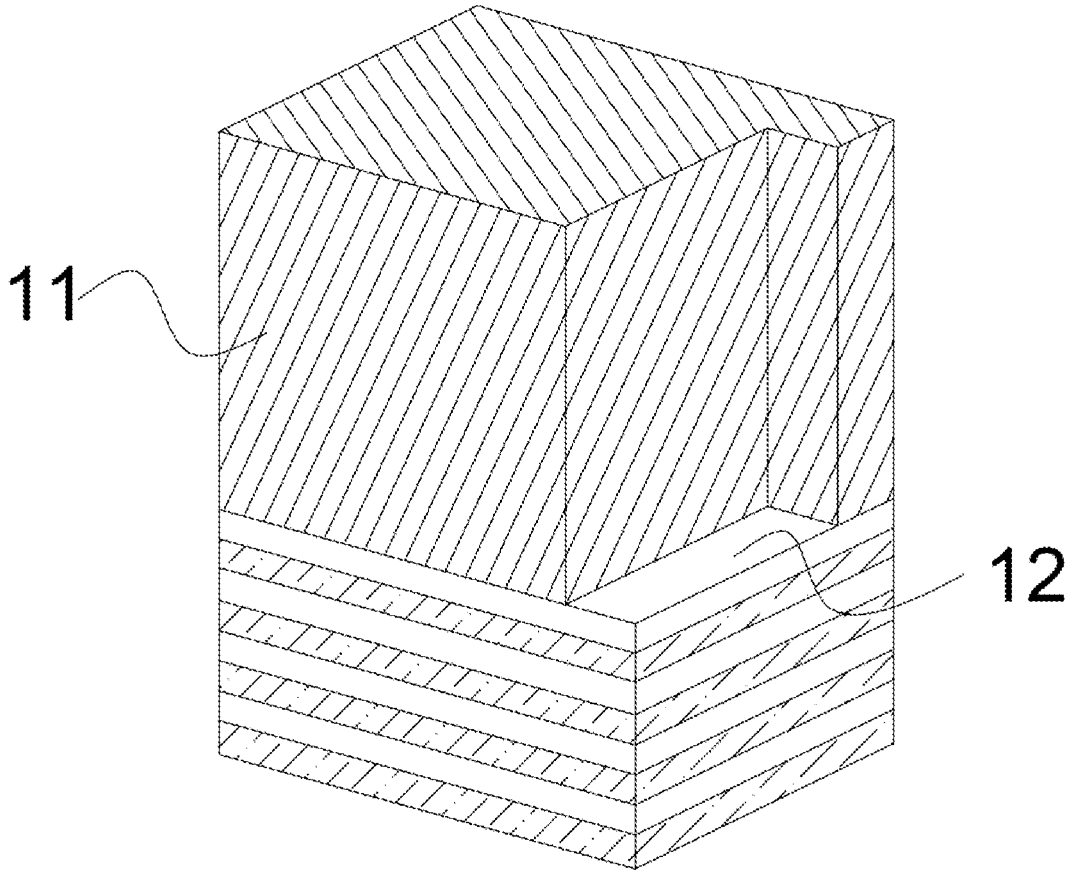
FIG. 4 is a schematic diagram of etching a first-mask layer.

This embodiment includes the following steps:

A) A three-dimensional storage structure is composed of vertically stacked conductive layers and insulating layers, with a conductive layer on the top, as shown in FIG. 2. The top of the three-dimensional storage structure is covered with a first-mask layer 11, as shown in FIG. 3. Then, a preset entire stepped region is defined through a lithography process, and the first-mask layer 11 is etched to expose the conductive layer 12 on the top of the stepped region, as shown in FIG. 4. The stepped region is a preset stepped region in the three-dimensional storage structure for forming a stepped structure.

Specifically, in this step, the entire stepped region is defined by a photoresist and the first-mask layer 11 is vertically etched. The first-mask layer is typically a hard mask, or a photoresist with strong etching specificity. Etching is performed until a horizontal wire (conductive layer 12) on the top is exposed. The first-mask layer 11 is used to protect all areas where stepped horizontal wires do not need to be prepared.

Figure 5:
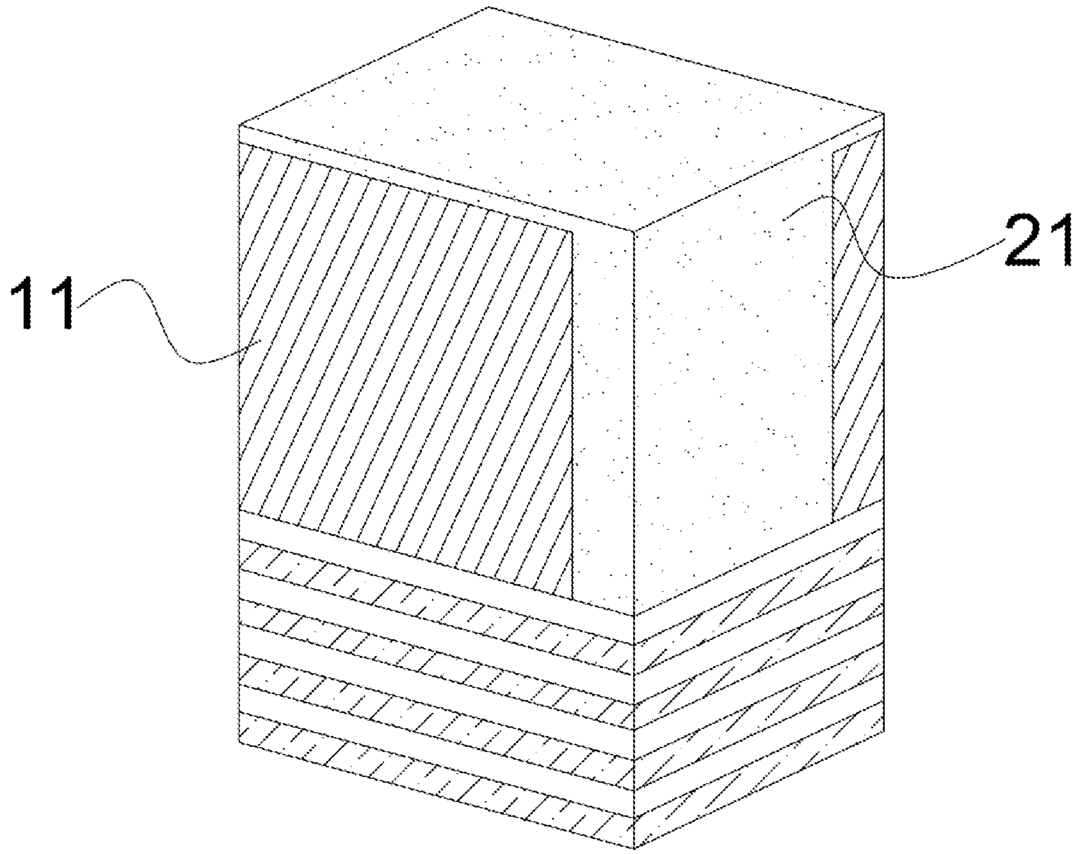
FIG. 5 is a schematic diagram of setting a second-mask layer.
Figure 6:
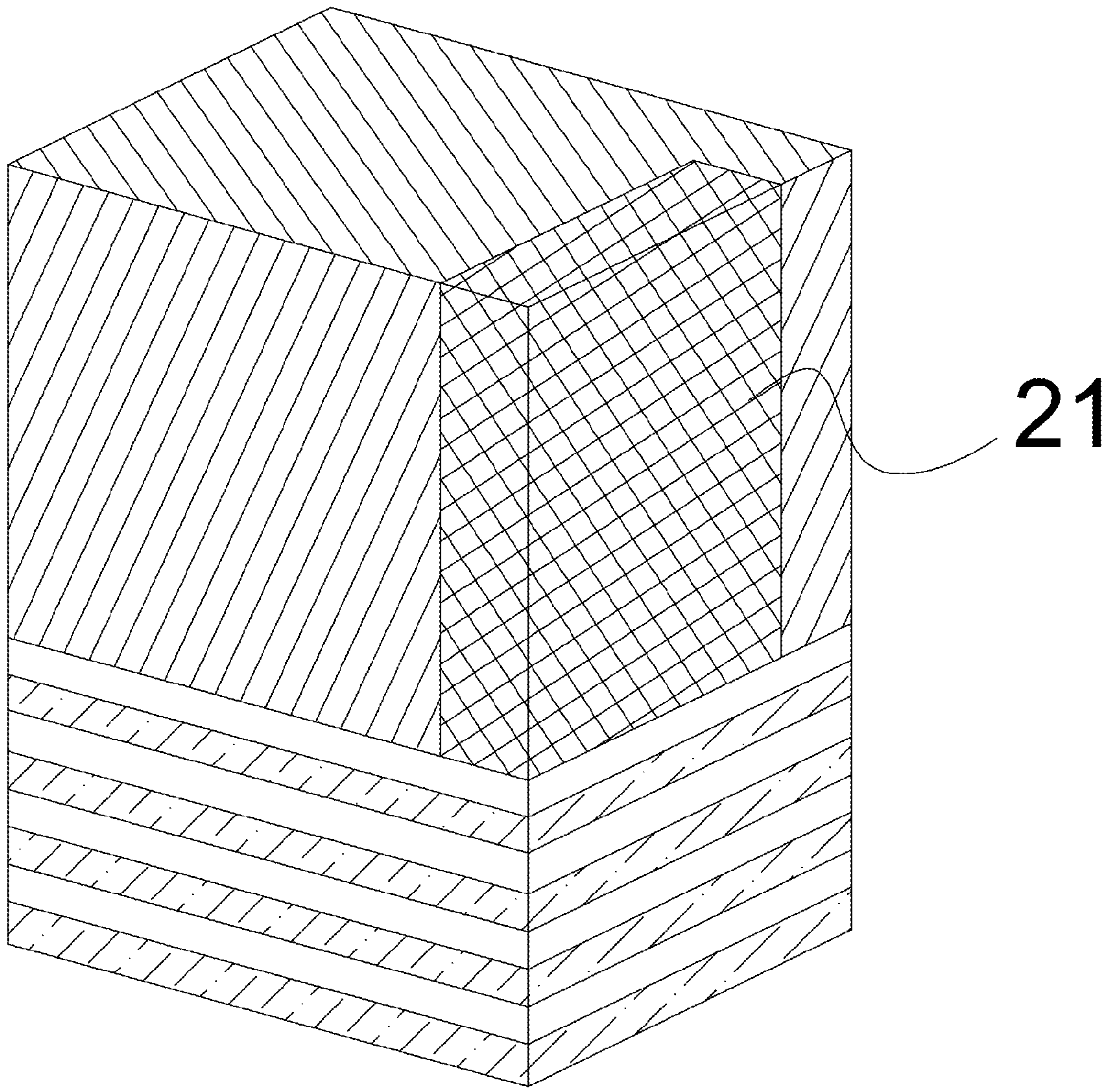
FIG. 6 is a schematic diagram of removing the second-mask layer on the top.

B) A second-mask layer 21 is deposited in the region exposed in the previous step, and then material of the second-mask layer on the top is removed, as shown in FIG. 5 and FIG. 6. The second-mask layer 21 is usually a hard mask or photoresist with etching specificity different from the first-mask layer 11.

Figure 7:
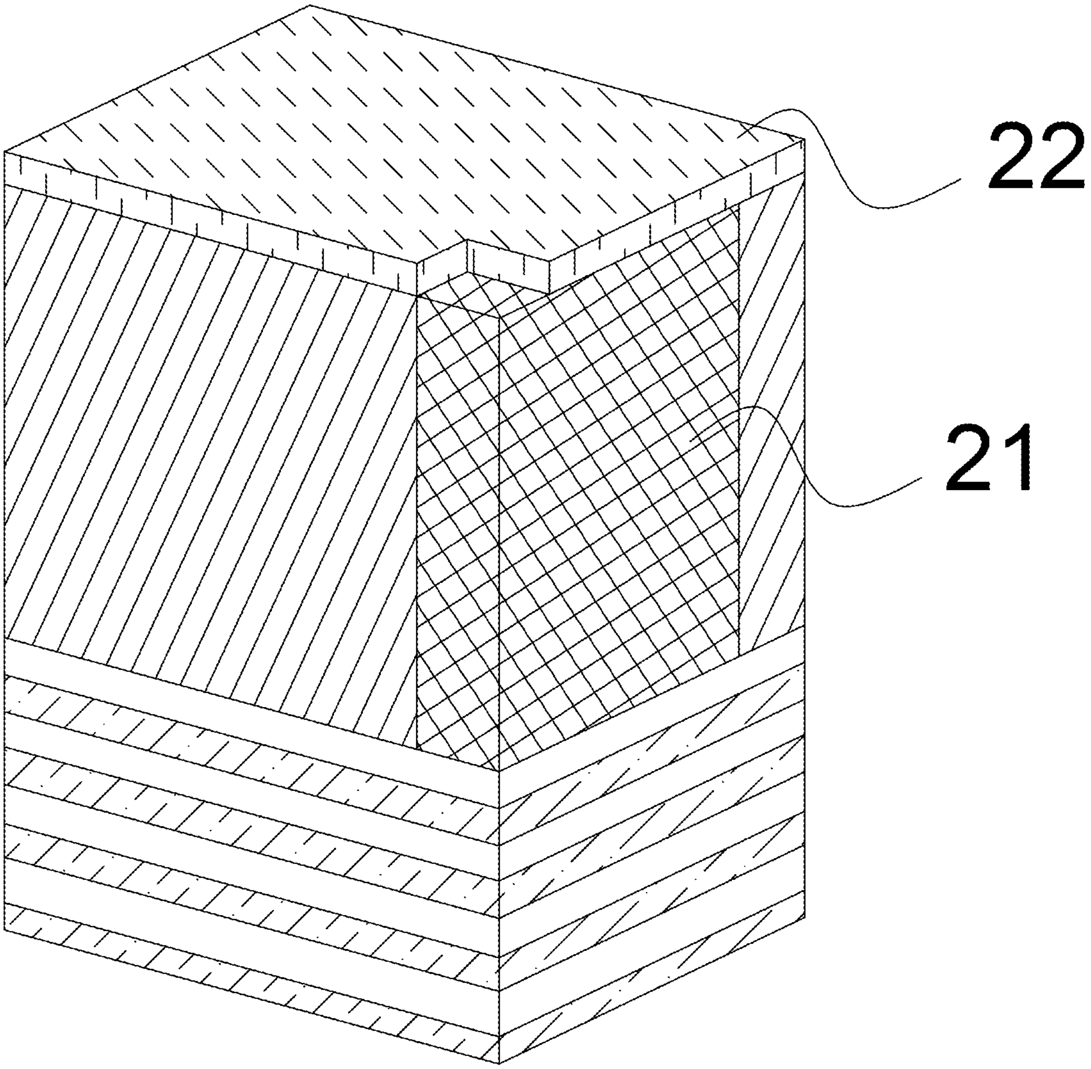
FIG. 7 is a schematic diagram of defining a first-layer step area using a photoresist.
Figure 8:
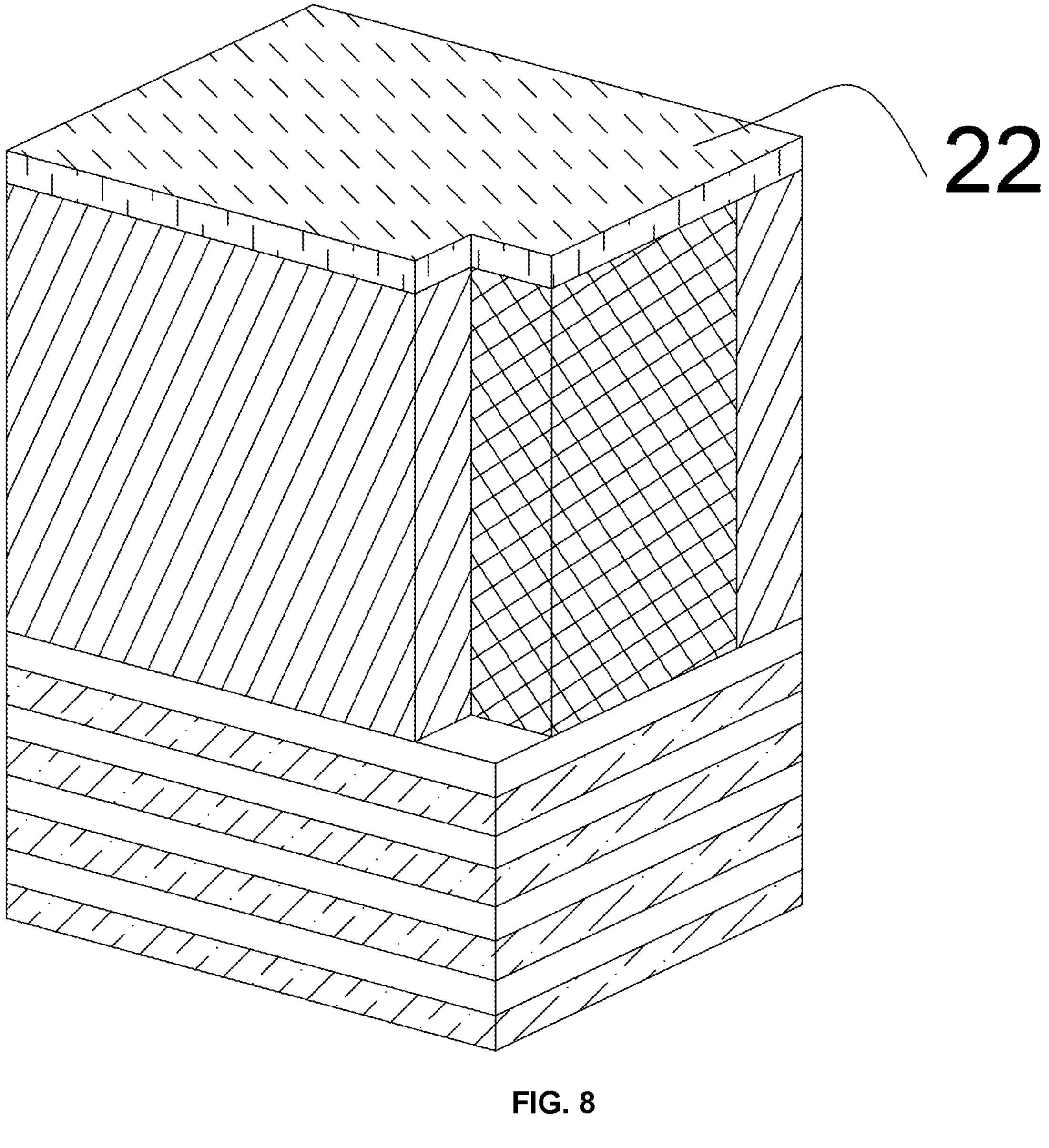
FIG. 8 is a schematic diagram of etching a first-layer step area.

C) A first step region is defined again through the photoresist 22, and the second-mask layer 21 is vertically etched, to expose the conductive layer on the top, as shown in FIG. 7 and FIG. 8.

Figure 9:
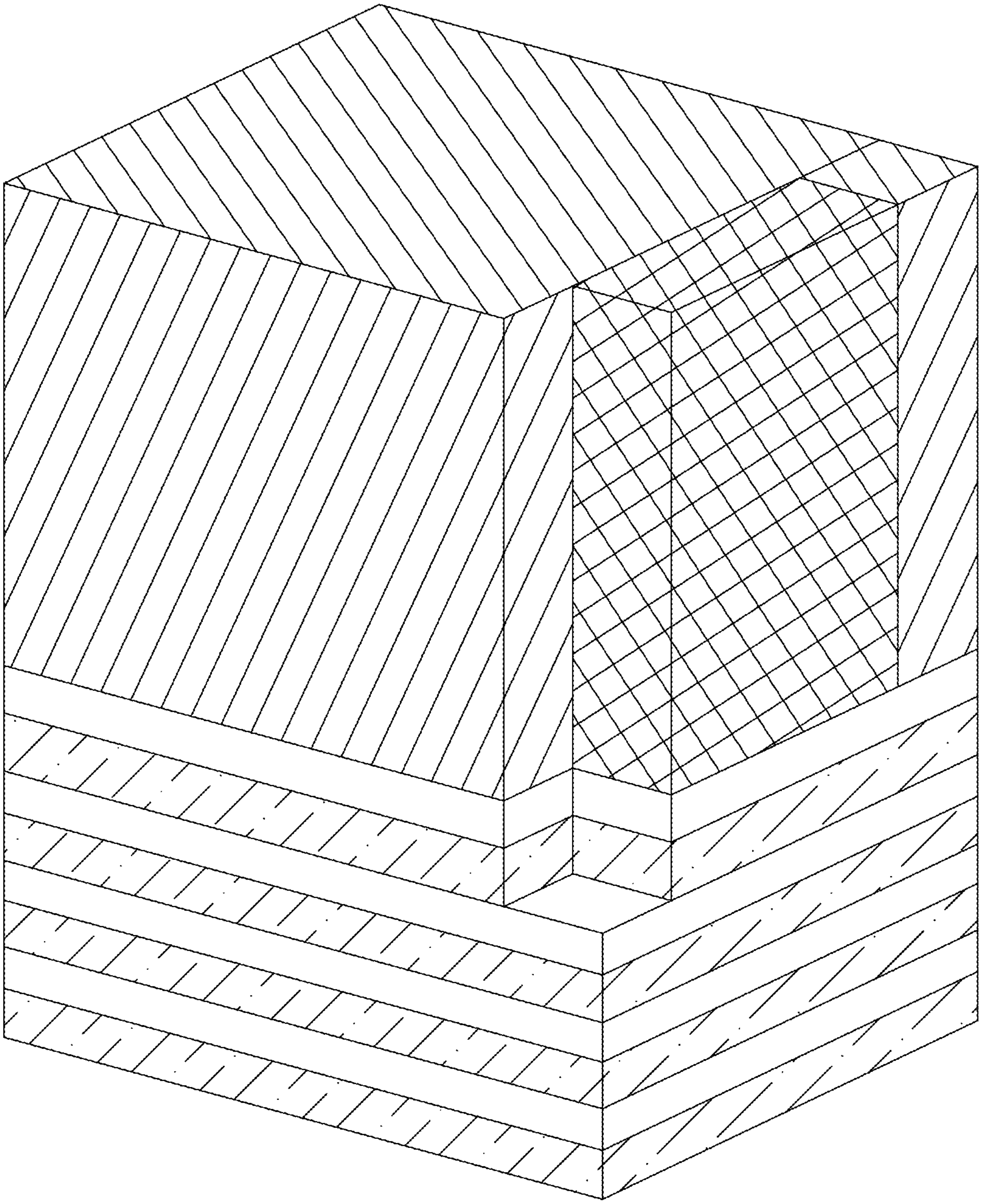
FIG. 9 is a schematic diagram of etching to a conductive layer in the second layer.

D) An exposed portion of the three-dimensional storage structure is vertically etched until a next conductive layer is exposed, as shown in FIG. 9.

Figure 10:
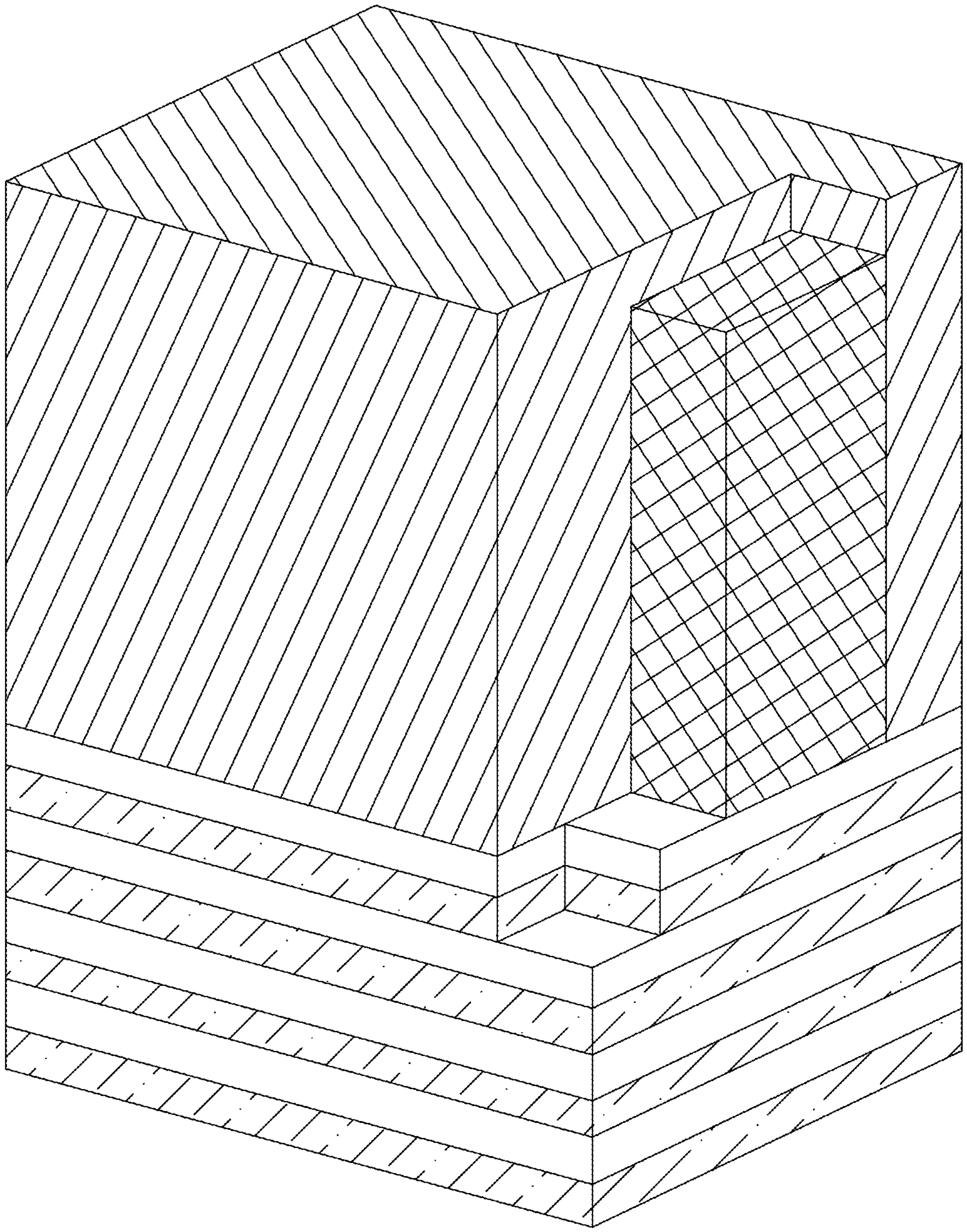
FIG. 10 is a schematic diagram of isotropically etching a second-mask layer.

E) The second-mask layer 21 is trimmed through isotropic etching according to a required step width for etching, as shown in FIG. 10, to expose an area for next etching.

Figure 11:
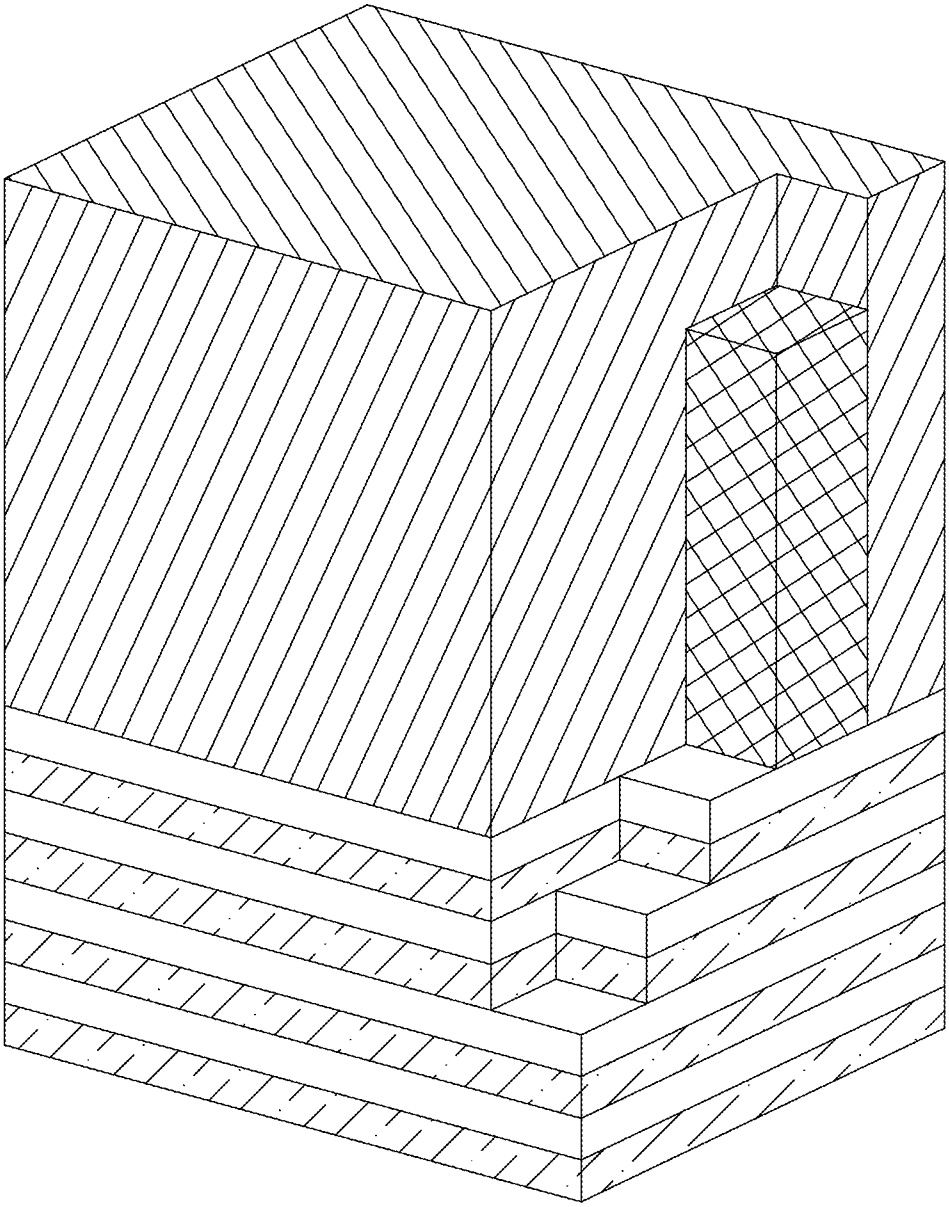
FIG. 11 is a schematic diagram of forming three-layer steps.
Figure 12:
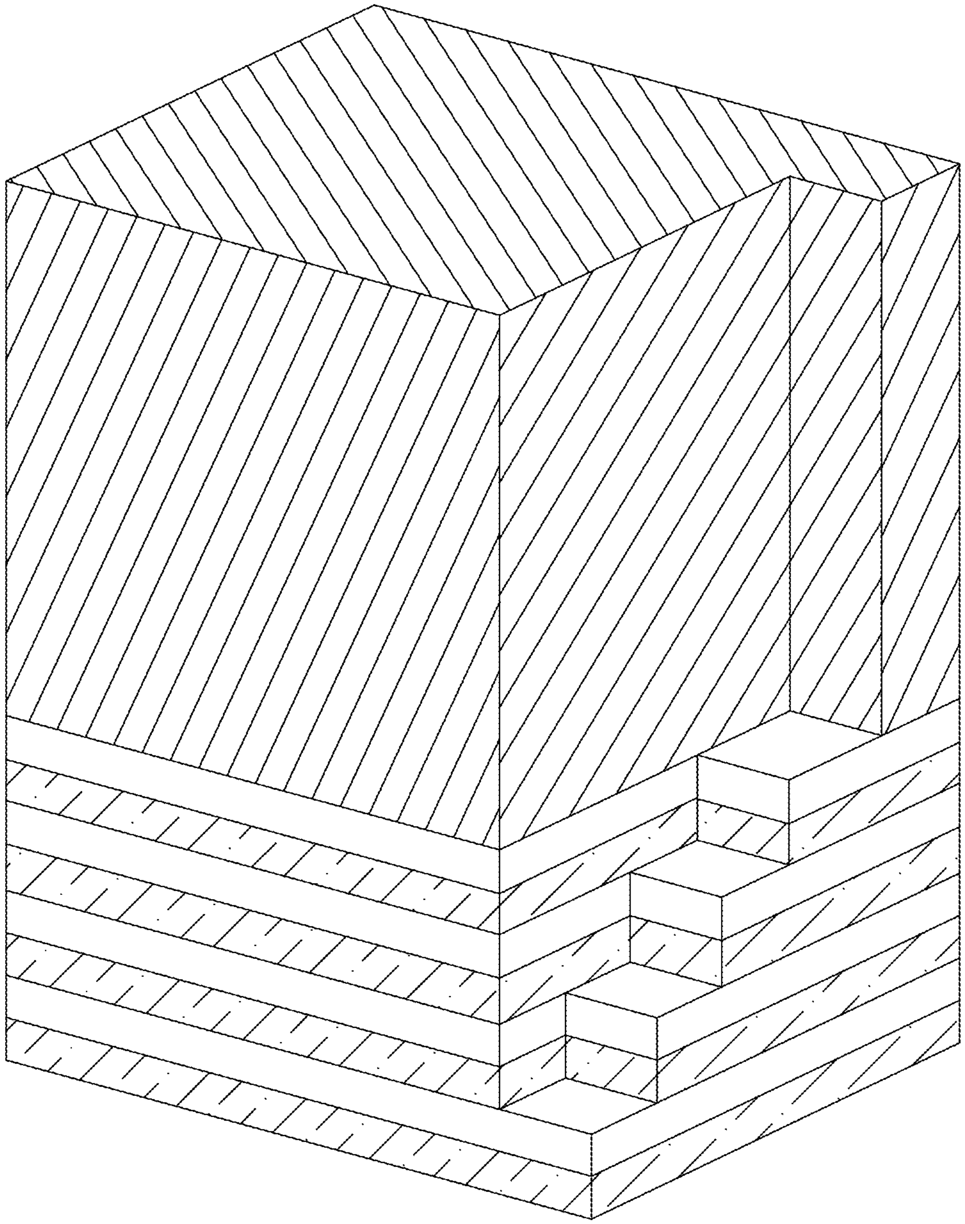
FIG. 12 is a schematic diagram of forming four-layer steps.
Figure 13:
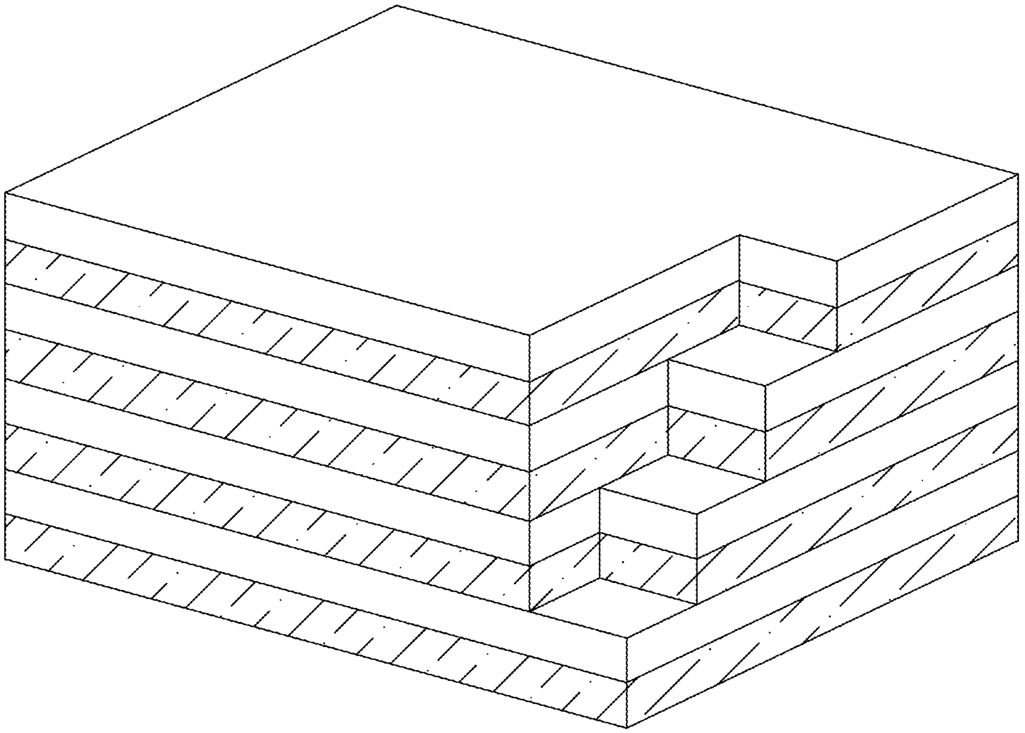
FIG. 13 is a schematic perspective view of a high-density three-dimensional memory with a lateral lead-out structure.
Figure 14:
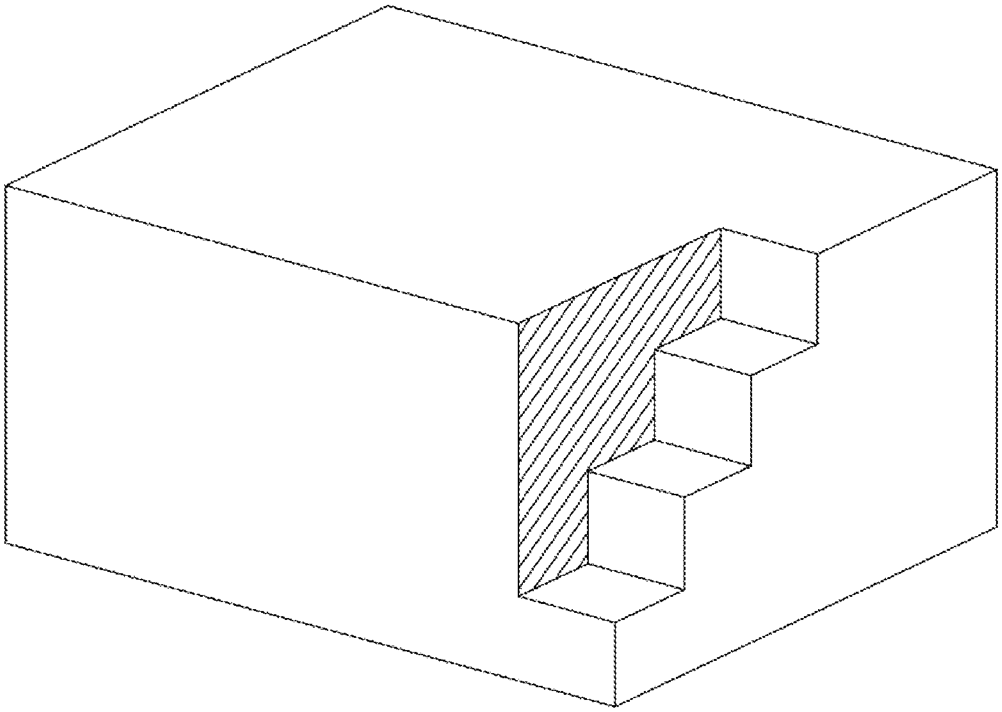
FIG. 14 is a schematic diagram of a projection relationship.

The process of trimming the second-mask layer 21 and etching the three-dimensional storage structure is repeated until a predetermined stepped lead-out structure is formed, as shown in FIG. 11, FIG. 12, and FIG. 13. Projection of the lead-out structure on an etching facade of the three-dimensional storage structure forms a stepped shape. FIG. 14 illustrates the etching facade with a shaded area, i.e., the face formed by etching the three-dimensional storage structure. Forming the step in each layer requires etching of the three-dimensional storage structure, and an etching facade is generated. In this embodiment, the etching facades generated in the steps in all layers are coplanar, all located in a plane indicated by the shaded area in FIG. 14.

Embodiment 2

Referring to FIG. 13 and FIG. 14, this embodiment provides a memory, including a three-dimensional storage structure, which is formed by alternately stacked conductive layers and insulating layers, and a lead-out structure. A contact surface of the lead-out structure with an etching facade of the three-dimensional storage structure has a stepped edge line. The etching facade is a plane of a side surface of the three-dimensional storage structure, which is generated due to etching and perpendicular to a bottom surface.

Projection of the lead-out structure on the etching facade of the three-dimensional storage structure forms a stepped shape. Refer to the projection relationship shown in FIG. 14.

In the above embodiment, a 4-layer stepped structure is used as an example. In reality, the number of layers in the three-dimensional storage structure is much greater than 4 (one conductive layer and one insulating layer are considered with one layer), and the number of stepped layers is also much greater than 4. When the number of stepped layers is large, due to the isotropic etching of the second-mask layer (the thickness of the second-mask layer is reduced during etching), there may be a situation where not all stepped layers are etched but the second-mask layer has been completely removed by etching. In this case, the same processing method as the prior art (the process of preparing the stepped structure shown in FIG. 1) can be adopted, i.e., a new second-mask layer is deposited and an exposed region is defined through a lithography process. Then, the remaining cyclic stepped etching is continued. Each time a new second-mask layer is deposited, a new lithography process is required.

The illustration is made using an embodiment:

Embodiment 3

A preparation method for an interconnection structure of a high-density 3D-stacked memory is provided, including the following steps:

1) As shown in FIG. 4, the top of the three-dimensional storage structure is covered with a first-mask layer 11, then etching is performed to expose the conductive layer 12 on the top of the stepped region (i.e., the top conductive layer among all the conductive layers). The three-dimensional storage structure is formed by vertically stacked conductive layers and insulating layers, and the stepped region is a preset stepped region in the three-dimensional storage structure for forming a stepped structure.

2) The exposed conductive layer in the stepped region is covered with a second-mask, as shown in FIG. 5.

3) N is set to 1, and then the following steps (a) to (c) are repeated until the conductive layer at a bottom of the stepped region is exposed, as shown in FIG. 6 to FIG. 12:

(a) If the second-mask layer 21 in the stepped region has a thickness greater than or equal to a preset threshold, the second-mask in an $N^{th}$ step region is removed by etching, to expose the top of the three-dimensional storage structure beneath the second-mask, where the $N^{th}$ step region refers to a projection region of an $N^{th}$ step on a plane of a bottom surface of the second-mask layer 21. The stepped layers are counted in sequence from the bottom of the three-dimensional structure to the top.

If the thickness of the second-mask layer 21 is less than the preset threshold, it is necessary to supplement the thickness of the second-mask by deposition. Then, the second-mask layer 21 is trimmed through lithography, restoring a coverage region of the second-mask layer 21 to its state before the supplementation (i.e., the coverage position and area of the second-mask layer remain unchanged after the supplementation, but the thickness increases). Then, the second-mask in the $N^{th}$ step region is removed by etching, to expose the top of the three-dimensional storage structure beneath the second-mask. The $N^{th}$ step region refers to a projection region of an $N^{th}$ step on the bottom surface of the second-mask.

(b) If a top of a currently exposed region is an insulating layer, the currently exposed region of the three-dimensional storage structure is vertically etched until the conductive layer is exposed; if the top of the currently exposed region is a conductive layer, the currently exposed region of the three-dimensional storage structure is vertically etched until a next conductive layer is exposed, where a face formed by etching the three-dimensional storage structure serves as an etching facade of the $N^{th}$ step.

(c) N is incremented by 1 and step (a) is performed again.

The etching facades of the steps in all layers are in a same plane.

What is claimed is:

1. A preparation method for an interconnection structure of a high-density 3D-stacked memory, comprising the following steps:

1) covering a top of a three-dimensional storage structure with a first-mask layer and then performing etching, to expose a conductive layer on a top of a stepped region, wherein the three-dimensional storage structure is formed by vertically stacked conductive layers and insulating layers, and the stepped region is a preset stepped region in the three-dimensional storage structure for forming a stepped structure;

2) covering the exposed conductive layer in the stepped region with a second-mask layer; and 3) setting N to 1, and then repeating the following steps (a) to (c) until the conductive layer at a bottom of the stepped region is exposed:

(a) etching to remove the second-mask layer in an $N^{th}$ step region, to expose the top of the three-dimensional storage structure beneath the second-mask layer, wherein the $N^{th}$ step region refers to a projection region of an $N^{th}$ step on a bottom surface of the second-mask layer;

(b) if a top of a currently exposed region is an insulating layer, vertically etching the currently exposed region of the three-dimensional storage structure until the conductive layer is exposed; if the top of the currently exposed region is a conductive layer, vertically etching the currently exposed region of the three-dimensional storage structure until a next conductive layer is exposed, wherein a face formed by etching the three-dimensional storage structure serves as an etching facade of the $N^{th}$ step; and (c) incrementing N by 1 and returning to step (a);

wherein the etching facades of the steps in all layers are in the same plane; and wherein in step 1), the preset stepped region is defined by a photoresist; the photoresist covers an upper surface of a first-mask layer, and the first-mask layer in the stepped region defined by the photoresist is etched; and step 2) comprises covering an upper surface of the three-dimensional storage structure with the second-mask layer and then removing the photoresist and the second-mask layer on the photoresist.

2. The preparation method for an interconnection structure of a high-density 3D-stacked memory according to claim 1, wherein in step (a), the $N^{th}$ step region of the second-mask layer is defined by a photoresist, and then the defined region is isotropically etched.

3. The preparation method for an interconnection structure of a high-density 3D-stacked memory according to claim 1, wherein step (a) comprises:

if the second-mask layer in the stepped region has a thickness greater than or equal to a preset threshold, etching to remove the second-mask layer in the $N^{th}$ step region, to expose the top of the three-dimensional storage structure beneath the second-mask layer, wherein the $N^{th}$ step region refers to the projection region of the $N^{th}$ step on the bottom surface of the second-mask layer; and if the thickness of the second-mask layer is less than the preset threshold, depositing the second-mask layer again to supplement the thickness of the second-mask layer, and performing lithographic trimming to restore a coverage region to an original state before the supplementation; then, etching to remove the second-mask layer in the $N^{th}$ step region, to expose the top of the three-dimensional storage structure beneath the second-mask layer, wherein the $N^{th}$ step region refers to the projection region of the $N^{th}$ step on the bottom surface of the second-mask layer.

* * * * *